United States Patent
Hanke et al.

(10) Patent No.: US 7,068,059 B2
(45) Date of Patent: Jun. 27, 2006

(54) ARRANGEMENT FOR PRODUCING AN ELECTRICAL CONNECTION BETWEEN A BGA PACKAGE AND A SIGNAL SOURCE, AND METHOD FOR PRODUCING SUCH A CONNECTION

(75) Inventors: André Hanke, Strausberg (DE); Stephan Dobritz, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/944,537

(22) Filed: Sep. 17, 2004

(65) Prior Publication Data

US 2005/0085105 A1 Apr. 21, 2005

(30) Foreign Application Priority Data

Sep. 17, 2003 (DE) ................. 103 43 256

(51) Int. Cl.
  *G01R 31/02* (2006.01)
(52) U.S. Cl. ....................... 324/765; 324/755
(58) Field of Classification Search .................. None
  See application file for complete search history.

(56) References Cited

U.S. PATENT DOCUMENTS

| | | | |
|---|---|---|---|
| 4,468,615 A * | 8/1984 | Jamet et al. ................ 324/754 |
| 4,554,505 A * | 11/1985 | Zachry ....................... 324/755 |
| 5,808,474 A | 9/1998 | Hively et al. | |
| 6,321,443 B1 | 11/2001 | Barte et al. | |
| 6,330,744 B1 | 12/2001 | Doherty et al. | |
| 6,416,332 B1 | 7/2002 | Carron et al. | |
| 6,428,327 B1 * | 8/2002 | Tamarkin et al. ............. 439/67 |
| 6,468,098 B1 | 10/2002 | Eldridge | |
| 6,541,872 B1 | 4/2003 | Schrock et al. | |
| 2002/0042639 A1 | 4/2002 | Murphy-Chutorian et al. | |
| 2002/0121911 A1 | 9/2002 | Yang et al. | |
| 2003/0006790 A1 | 1/2003 | Holcombe | |
| 2004/0038496 A1 | 2/2004 | Lee et al. | |

FOREIGN PATENT DOCUMENTS

| | | |
|---|---|---|
| DE | 198 33 131 A1 | 4/2000 |
| EP | 0 996 154 A1 | 4/2000 |
| JP | 07-106491 | 4/1995 |
| JP | 2001-015227 | 1/2001 |
| JP | 2002-151627 | 5/2002 |
| WO | WO 97/00598 | 1/1997 |
| WO | WO 02/09194 A1 | 1/2002 |

* cited by examiner

Primary Examiner—Minh N. Tang
(74) Attorney, Agent, or Firm—Slater & Matsil, L.L.P.

(57) ABSTRACT

An arrangement for producing an electrical connection between a ball grid array (BGA) package and a signal source is disclosed. A flexible printed circuit board (PCB) has conductor (e.g., copper) tracks arranged between flexible plastic layers. A contact receptacle with guide elements for the BGA package is located over a portion of the flexible PCB. Contact structures are electrically coupled to the conductor tracks of the flexible PCB and accessible via the contact receptacle. The contact structures serve for providing an electrical contact-connection of terminals of a BGA package placed in the receptacle. The contact structures comprise column- or sleeve-shaped contact elements that extend through the flexible PCB and project upwards on one side from one of the flexible plastic layers.

21 Claims, 1 Drawing Sheet

ARRANGEMENT FOR PRODUCING AN ELECTRICAL CONNECTION BETWEEN A BGA PACKAGE AND A SIGNAL SOURCE, AND METHOD FOR PRODUCING SUCH A CONNECTION

This application claims priority to German Patent Application 103 43 256.6, which was filed Sep. 17, 2003, and is incorporated herein by reference.

TECHNICAL FIELD

The invention relates to an arrangement for producing an electrical connection between a BGA package and a signal source using a contact receptacle with guide elements for the BGA package, and also contact structures situated in the contact receptacle and serving for the electrical contact-connection of the terminals of the BGA package for the burn-in and the functional test.

BACKGROUND

The contact receptacles for functional testing of FPBGA packages often have, for electrical conduct-connection, spring pins (pogo pins) or micro-spring contacts that are used for the contact-connection of the contact terminals in the form of solder ball contact arrays of the FPBGA packages. In this case, the contacts are arranged in the grid pitch precisely like the solder balls of the micro-ball contact array.

However, these contacts are not sufficient to meet the future requirements made of test receptacles. In particular, consideration is given to unresolved problems such as the non-lossless energy transmission by virtue of existing discontinuities and also the contamination of the test systems by extremely fine abrasion on all the sliding parts of the test system.

The limiting frequency is 1 GHz, for example, in the case of the spring pins having a length of approximately 5 mm that are customarily used. This is due to the dynamic internal resistances of the contact system.

Furthermore, the test receptacles are subjected to high thermal loading due to the continual miniaturization of the integrated circuits and the associated poorer heat dissipation. The consequence of this is that both the contact element and the solder ball are subjected to severe thermal loading and thus corrode rapidly.

Moreover, the continual reduction of the connecting pitch leads to a non-linear rise in the signal crosstalk, which cannot be avoided with known technical solutions, such as with spring pins, for example.

Owing to the reasons mentioned above, it is necessary to develop cost-effective test receptacles that are both mechanically highly stable, insensitive to thermal effects and solve the problem of crosstalk in the case of small connecting pitches. In this case, the contact elements must have good self-cleaning capacities and additionally be able to reliably penetrate a substrate situated on the contact balls.

SUMMARY OF THE INVENTION

One aim of a further development is to achieve more than 250,000 contact-connections per contact receptacle under production conditions. Moreover, owing to the high-frequency test signals required, particular tension is to be paid to a lossless energy transmission from the energy source to the DUT (device under test), i.e., the BGA package to be tested. Thus, the complete signal path including the printed circuit board must be optimized. Furthermore, an unproblematic repairability and exchangeability of the test receptacles is expected.

With this in mind, aspects of the invention provide an arrangement for producing an electrical connection between a BGA package and a signal source using a contact receptacle with guide elements for the BGA package. In addition, contact structures are situated in the contact receptacle and serve for the electrical contact-connection of the terminals of the BGA package (DUT or "device under test") for the burn-in and the functional test, which arrangement can be produced simply and cost-effectively, and also of creating a method for producing contact structures.

In the case of an arrangement of the type mentioned in the background, the contact structures belong to a flexible PCB (printed circuit board) having Cu conductor tracks arranged between flexible plastic layers, in that column- or sleeve-shaped contact elements extend through the PCB, which contact elements are electrically connected to the Cu conductive track and project upwards on one side from one of the plastic layers.

One novel aspect of certain embodiments of this contact system is that the contact between the chip, i.e., the bonding pads thereof, and the contact elements is realized by a defined pressure on the chip.

In a first refinement of the invention, the flexible PCB (printed circuit board) is arranged in the contact receptacle on an elastic structure. The spring excursion that is customary for maintaining the contact force in the case of conventional spring pins is thus now achieved by means of the elasticity of the flexible substrate and, if appropriate, by means of further elastic additional elements.

Elastomer inserts, potting foams, thermoplastic elastomers, or rubber or rubber-like elements may be provided as contact-force-maintaining elements.

In a development of the invention, it is provided that the contact-force-maintaining elements are arranged below the PCB by being placed behind, injected behind, adhesive bonding, hot sealing, rubber coating or the like, in which case the contact-force-maintaining elements may have a composite adhesion with the PCB.

A further refinement of the invention is characterized in that the PCB is releaseably connected to the contact receptacle.

Finally, it is provided that the contact receptacle is assigned elements for power loss dissipation. Any unnecessary heating of the chip may thus be prevented.

In another aspect, of the invention, the contact receptacle is assigned elements for homogeneous heat distribution.

Furthermore, further components, such as backup capacitors, may be arranged in the contact receptacle, the supply lines of the contact receptacle being formed as a flexible substrate.

A further refinement of the invention provides for the contact structures to be releaseably connected to the contact receptacle.

In order to improve the electrical contact, the contact elements are equipped with crowns that are pressed into the contact elements in a force-locking and positively locking manner.

In yet another aspect, the invention provides a method that is characterized in that microvias in the BGA pitch are introduced into a flexible PCB having Cu conductive tracks arranged between flexible plastic layers, in that the microvias are subsequently filled with an electrically conductive material, at least the walls of the microvias being coated, as a result of which the contact elements are produced, and in that one of the flexible plastic layers of the flexible PCB is thinned by etching, so that the electrically conductive filling material projects partially from the surface.

The thinning of the flexible plastic layer may be effected by plasma etching or other suitable selective etching methods.

In a refinement of the invention, the microvias are introduced into the flexible PCB by means of photolithography in conjunction with plasma etchings.

It is also possible to introduce the microvias into the flexible PCB mechanically.

BRIEF DESCRIPTION OF THE DRAWINGS

The invention will be explained in more detail below using an exemplary embodiment. In the associated figures of the drawing.

List of Reference Symbols

Figure 1:
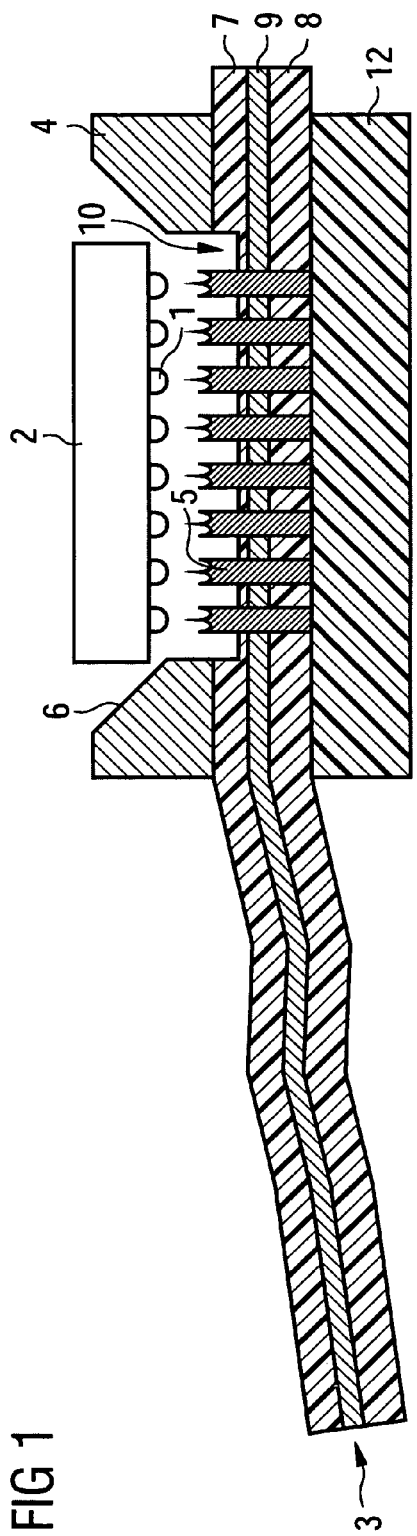
FIG. 1 shows an arrangement for producing an electrical connection in a contact receptable with a flexible PCB and contact elements for the contact-connection of a BGA package.

| 1 | Chip terminal |
|---|---|
| 2 | FPBGA package |
| 3 | Flexible PCB |
| 4 | Contact receptacle |
| 5 | Contact element |
| 6 | Guide level |
| 7 | Polyimide film |
| 8 | Polyimide film |
| 9 | Cu conductive track |
| 10 | Depression |
| 11 | Crown |
| 12 | Elastic additional element |

DETAILED DESCRIPTION OF ILLUSTRATIVE EMBODIMENTS

The invention describes the construction of a new contact system for producing electrically low-loss, re-releaseable connections between the terminals 1 of an FPBGA (fine pitch ball grid array) package 2 and a signal source (not illustrated) by means of a flexible PCB 3 in particular for use in the areas of bum-in and functional test.

The contact system comprises a contact receptacle 4, which receives in a positively locking manner the package 2 that is to be contact-connected. A contact-connection between the chip terminals 1 and the corresponding contact elements 5 of the flexible PCB 3 is performed by means of a defined pressure on the package 2. In order to facilitate the insertion of the package 2 to be contact-connected, guide levels 6 are provided on the contact receptacle.

The flexible PCB 3 comprises two polyimide films 7, 8 with conductive tracks 9 lying in between in one or a plurality of planes (layers). In the preferred embodiment, the conductive tracks 9 are formed from copper. Other conductors could alternatively be used.

The corresponding contact elements 5 on the flexible PCB 3 are column- or sleeve-shaped-like contact elements 5 that have been partially uncovered from the flexible PCB 3 (polymer substrate) by means of plasma etching, with the result that a depression 10 is produced in the region of the contact elements 5.

In order to produce such column- or sleeve-like contact elements 5, holes (microvias) are introduced into the polymer substrate—for example by means of stamping or plasma etching—precisely at the contact points—to be connected—with the chip 2 or FPBGA package and are filled with an electrically conductive material. After the removal of the etching mask for the holes that is used during the plasma etching, the flexible substrate material can then be partially removed in a further highly selective plasma etching operation, with the result that a depression 10 is produced in the polymer substrate and only the column-shaped contact structures 5 remain in the form of column-like pins. The thinning may also be effected by other suitable selective etching methods.

In this respect, the invention also encompasses all techniques, which serve for forming crowns 11 at the ends of the contact structures 5 (pins).

Figure 2:
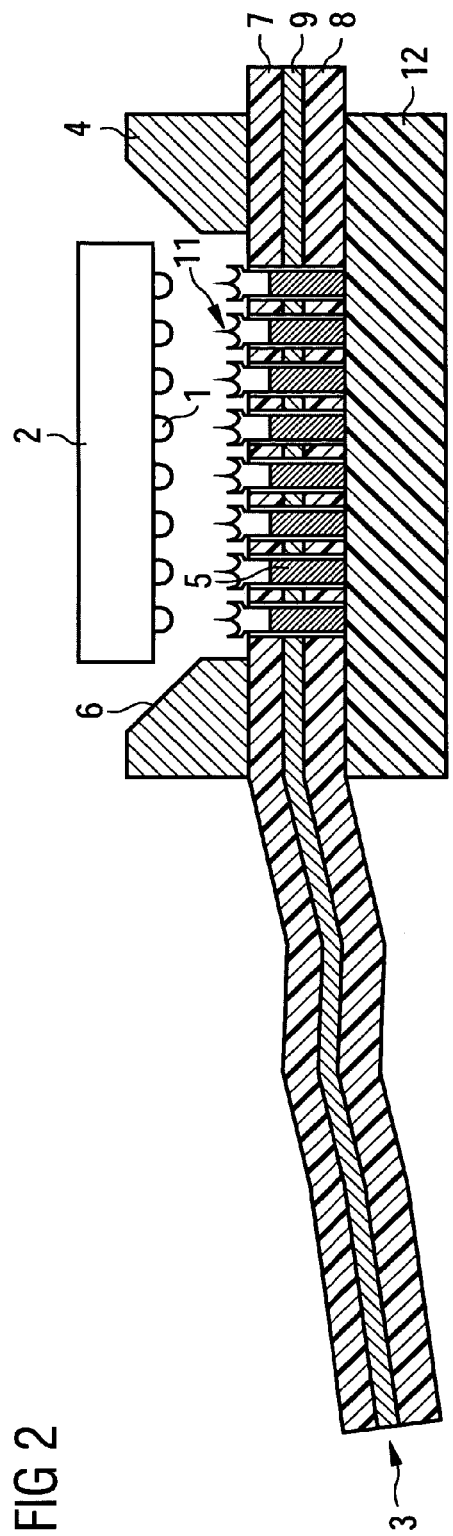
FIG. 2 shows a variant of the arrangement according to FIG. 1 with additional contact crowns.

Moreover, consideration is given to the pressing techniques as a further solution for realizing corresponding contact structures in a flexible substrate. In this case, column-like contact crowns 11 are introduced into the receptacle with the flexible substrate in a force-locking and positively locking manner (FIG. 2).

The construction of the preferred embodiment contact system is additionally characterized by the fact that the spring excursion of the conventional spring pins that is customarily used for maintaining the contact force is, in this case, achieved by means of the elasticity of the flexible substrate (flexible PCB 3) and, if appropriate, by means of further elastic additional elements 12, which are arranged below the flexible PCB 3.

Such a combination is characterized in that the flexible substrate enters into a composite adhesion with further elastic additional elements 12, contact-force-maintaining elements—which may be for example elastomer inserts, potting compositions or potting foams, thermoplastic elastomers and also rubbers—completely or in part, for example by being placed behind, injected behind, adhesive bonding, hot sealing, rubber coating etc.

The contact system construction is additionally characterized in that the contact system construction described or parts thereof may additionally perform, besides the contact production, other additional functions such as power loss dissipation or a homogeneous heat distribution. The integration of further components, for example of backup capacitors, shall also be described.

The supply lines of the contact system may likewise be realized by means of the flexible substrate (flexible PCB 3) in order to keep internal or contact resistances as low as possible. The contact receptacle 4 with the contact-connecting system is arranged in exchangeable fashion on a carrying device.

What is claimed is:

1. An arrangement for producing an electrical connection between a ball grid array (BGA) package and a signal source, the arrangement comprising:
   a flexible printed circuit board (PCB) having conductor tracks arranged between flexible plastic layers;
   a contact receptacle with guide elements for the BGA package, the contact receptacle over a portion of the flexible PCB; and
   contact structures electrically coupled to the conductor tracks of the flexible PCB and accessible via the contact receptacle, the contact structures serving for providing an electrical contact-connection of terminals of the BGA package placed in the receptacle, wherein the contact structures comprise column- or sleeve-shaped contact elements that extend through the flexible PCB and project upwards on one side from one of the flexible plastic layers.

2. The arrangement according to claim 1, further comprising an elastic additional element arranged in contact with the flexible PCB beneath the contact structures.

3. The arrangement according to claim 1, further comprising further contact-force-maintaining elements provided below the flexible PCB.

4. The arrangement according to claim 3, wherein the contact-force-maintaining elements comprise elastomer inserts.

5. The arrangement according to claim 3, wherein the contact-force-maintaining elements comprise potting compositions or potting foams.

6. The arrangement according to claim 3, wherein the contact-force-maintaining elements comprise thermoplastic elastomers.

7. The arrangement according to claim 3, wherein the contact-force-maintaining elements comprise rubber or rubber-like elements.

8. The arrangement according to claim 3, wherein the contact-force-maintaining elements have a composite adhesion with respect to the flexible PCB.

9. The arrangement according to claim 1, wherein the flexible PCB is releaseably connected to the contact receptacle.

10. The arrangement according to claim 1, wherein the contact receptacle comprises elements for power loss dissipation.

11. The arrangement according to claim 1, wherein the contact elements have crowns at a contact portion of the contact element.

12. The arrangement according to claim 11, wherein the crowns are pressed into the contact elements in a force-locking and positively locking maimer.

13. The arrangement according to claim 1, wherein the conductive tracks comprise copper tracks.

14. A method for producing contact structures, the method comprising:
providing a flexible printed circuit board (PCB) having conductive tracks arranged between flexible non-conductive layers;
introducing microvias into the flexible PCB, the microvias being arranged in a pitch of a ball grid away (BGA) device;
filling the microvias with an electrically conductive material such that at least walls of the microvias are coated; and
thinning at least one of the flexible non-conductive layers of the flexible PCB so that the electrically conductive material projects partially from a surface of the thinned flexible non-conductive layer.

15. The method according to claim 14, further comprising mounting a contact receptacle ova the thinned flexible non-conductive layer of the flexible PCB so as to expose the electrically conductive material that fills the microvias.

16. The method according to claim 15, further comprising affixing an elastic additional element to the flexible PCB beneath the electrically conductive material.

17. The method according to claim 14, wherein the thinning is effected by plasma etching or selective etching.

18. The method according to claim 14, wherein the microvias are introduced into the flexible PCB by means of photolithography.

19. The method according to claim 14, wherein the microvias are introduced mechanically.

20. The method according to claim 14, and further comprising providing further contact-force-maintaining elements below the flexible PCB.

21. The method according to claim 20, wherein the contact-force-maintaining elements are provided below the PCB by being placed behind, injected behind, adhesive bonded, hot sealed, or rubber coated.

* * * * *

UNITED STATES PATENT AND TRADEMARK OFFICE
CERTIFICATE OF CORRECTION

| | |
|---|---|
| PATENT NO. | : 7,068,059 B2 |
| APPLICATION NO. | : 10/944537 |
| DATED | : June 27, 2006 |
| INVENTOR(S) | : Hanke et al. |

It is certified that error appears in the above-identified patent and that said Letters Patent is hereby corrected as shown below:

Column 3, Line 48:   delete "bum-in" and insert --burn-in--.

Column 5, Line 36:   delete "maimer" and insert --manner--.

Signed and Sealed this

Twelfth Day of September, 2006

JON W. DUDAS
*Director of the United States Patent and Trademark Office*